(12) United States Patent
Sun

(10) Patent No.: US 9,870,090 B2
(45) Date of Patent: Jan. 16, 2018

(54) ARRAY SUBSTRATE, TOUCH DISPLAY DEVICE AND DRIVING METHOD THEREOF

(71) Applicants: XIAMEN TIANMA MICRO-ELECTRONICS CO., LTD., Xiamen (CN); TIANMA MICRO-ELECTRONICS CO., LTD., Shenzhen (CN)

(72) Inventor: Ying Sun, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 94 days.

(21) Appl. No.: 15/183,631

(22) Filed: Jun. 15, 2016

(65) Prior Publication Data

US 2017/0147127 A1 May 25, 2017

(30) Foreign Application Priority Data

Nov. 24, 2015 (CN) .......................... 2015 1 0824125

(51) Int. Cl.
*G06F 3/041* (2006.01)
*G02F 1/1333* (2006.01)
(Continued)

(52) U.S. Cl.
CPC ........ *G06F 3/0416* (2013.01); *G02F 1/13338* (2013.01); *G02F 1/133514* (2013.01);
(Continued)

(58) Field of Classification Search
CPC combination set(s) only.
See application file for complete search history.

(56) References Cited

U.S. PATENT DOCUMENTS

2016/0246418 A1* 8/2016 Wang .................. G11C 19/28
2016/0328037 A1* 11/2016 Zhuang ................ G06F 3/041
(Continued)

FOREIGN PATENT DOCUMENTS

CN          101281725 B    12/2011
CN          103823589 A     5/2014
(Continued)

*Primary Examiner* — Van Chow
(74) *Attorney, Agent, or Firm* — Kilpatrick Townsend & Stockton LLP

(57) ABSTRACT

The disclosure provides an array substrate, a touch display device and a driving method thereof. The array substrate includes a display region and a peripheral region. The display region includes a plurality of scan lines and the peripheral region comprises a gate electrode driving circuit and a touch driving circuit, the gate electrode driving circuit includes a plurality of stages of shift registers. Each of the plurality of stages of shift registers corresponds to and is electrically connected to one of the plurality of scan lines. The plurality of stages of shift registers are disposed at one side or two sides of the peripheral region. The shift registers disposed at at least one side of the peripheral region are divided into N groups of shift registers. The touch driving circuit includes N groups of touch selection outputting units corresponding to the N groups of shift registers.

18 Claims, 11 Drawing Sheets

(51) Int. Cl.
*G02F 1/1335* (2006.01)
*G09G 3/20* (2006.01)
*G09G 3/36* (2006.01)
*G11C 19/28* (2006.01)
*G06F 3/044* (2006.01)

(52) U.S. Cl.
CPC ............ *G06F 3/0412* (2013.01); *G09G 3/20* (2013.01); *G09G 3/3677* (2013.01); *G06F 3/044* (2013.01); *G09G 2310/0286* (2013.01); *G09G 2354/00* (2013.01); *G11C 19/28* (2013.01); *G11C 19/287* (2013.01)

(56) References Cited

U.S. PATENT DOCUMENTS

| | | | |
|---|---|---|---|
| 2017/0010731 A1* | 1/2017 | Zhang | G11C 19/28 |
| 2017/0132967 A1* | 5/2017 | Liu | G09G 3/2092 |
| 2017/0178749 A1* | 6/2017 | Ma | G11C 19/287 |

FOREIGN PATENT DOCUMENTS

| | | |
|---|---|---|
| CN | 103943083 A | 7/2014 |
| CN | 104240631 A | 12/2014 |
| CN | 104318885 A | 1/2015 |
| CN | 104485082 A | 4/2015 |
| CN | 104505014 A | 4/2015 |
| CN | 104820520 A | 8/2015 |
| KR | 20080051637 A | 6/2008 |

* cited by examiner

ARRAY SUBSTRATE, TOUCH DISPLAY DEVICE AND DRIVING METHOD THEREOF

CROSS-REFERENCES TO RELATED APPLICATIONS

This application claims priority to a Chinese patent application No. 201510824125.0 filed on Nov. 24, 2015 and entitled "Array Substrate, Touch Display Device and Driving Method thereof", the disclosure of which is incorporated herein by reference in its entirety.

TECHNICAL FIELD

The present disclosure relates to the field of liquid crystal display technologies, in particular to an array substrate, a touch display device and a driving method thereof.

TECHNICAL BACKGROUND

In the field of display technologies, display function and touch display provided in more and more products are integrated into a same display panel, thereby effectively reducing a thickness of a display panel. Among them, an in-cell touch display panel has a better performance in reducing the thickness.

The in-cell touch display panel is configured to integrate a plurality of touch driving electrodes onto an array substrate and perform a driving operation through a touch driving circuit disposed on a non-display region (also called as a peripheral region) of an array substrate.

The touch driving circuit includes a touch scanning circuit which is configured to sequentially generate a touch driving signal for each touch driving circuit. In addition, the non-display region of the array substrate is generally provided with a gate driving circuit for display. The gate driving circuit mainly includes a shift register corresponding to each row of pixel units. In a frame scanning process, a display scan signal is outputted by the shift register to turn on the each row of pixel units.

In the non-display region, each of the gate driving circuit and touch driving circuit has to occupy a certain area of the array substrate. After the touch function is integrated into the array substrate, a width of the non-display region of the array substrate is enlarged inevitably, so that a frame region of the display panel occupies a larger area. As a result, it cannot meet the requirement for the narrow-frame of the display panel by the user.

SUMMARY OF THE INVENTION

Embodiments provide an array substrate, a touch display device and a driving method thereof to meet the requirement of the narrow-frame of the display panel for a user.

In one aspect, embodiments provide an array substrate. The array substrate includes a display region and a peripheral region around the display region. The display region comprises a plurality of scan lines and the peripheral region comprises a gate electrode driving circuit and a touch driving circuit. The gate electrode driving circuit comprises a plurality of stages of shift registers. Each of the plurality of stages of shift registers is arranged to correspond to and electrically connected to one of the plurality of scan lines, and the plurality of stages of shift registers are disposed at one side or two sides of the peripheral region. The shift registers disposed at at least one side of the peripheral region are divided into N groups of shift registers, the stages of shift registers in each of the N groups of shift registers are sequentially electrically connected with each other in series, and the stages of shift registers from different groups of shift registers are arranged to be spaced apart from each other. Each stage of the shift register comprises a trigger signal input terminal and a secondary rigger signal outputting terminal, as for any two adjacent shift registers arranged to be electrically connected in series with each other in each group of shift registers, a trigger signal input terminal of the succeeding stage of shift register is connected with a secondary rigger signal outputting terminal of the preceding stage of shift register, wherein N is an integer larger than or equal to 2.

The touch driving circuit comprises N groups of touch selection outputting units corresponding to the N groups of shift registers. The number of the stages of touch selection outputting units in each of the N groups of touch selection outputting units is less than the number of the stages of shift registers in each of the N groups of shift registers. Each stage of touch selection outputting units comprises a strobe signal input terminal, and the strobe signal input terminal of each stage of touch selection outputting units in each group of touch selection outputting units is electrically connected with the secondary trigger signal outputting terminals of different stages of shift registers in corresponding one of the N groups of shift registers.

In a second aspect, embodiments provide a touch display device, including an array substrate, a color filter substrate opposite to the array substrate and a liquid crystal layer disposed between the array substrate and the color filter substrate, wherein the array substrate is the one according to the embodiments mention above.

In a third aspect, embodiments provide a method for driving a touch display device, array substrate of the touch display device comprises a display region and a peripheral region around the display region, the display region comprises a plurality of scan lines and the peripheral region comprises a gate electrode driving circuit and a touch driving circuit.

The gate electrode driving circuit comprises a plurality of stages of shift registers, each of the plurality of stages of shift registers is arranged to correspond to and electrically connected to one of the plurality of scan lines, and the plurality of stages of shift registers are disposed at one side or two sides of the peripheral region. The shift registers disposed at at least one side of the peripheral region are divided into N groups of shift registers, the stages of shift registers in each of the N groups of shift registers are sequentially electrically connected with each other in series, and the stages of shift registers from different groups of shift registers are arranged to be spaced apart from each other. Each stage of the shift register comprises a trigger signal input terminal and a secondary rigger signal outputting terminal, as for any two adjacent shift registers arranged to be electrically connected in series with each other in each group of shift registers, a trigger signal input terminal of the succeeding stage of shift register is connected with a secondary rigger signal outputting terminal of the preceding stage of shift register, wherein N is an integer larger than or equal to 2.

The touch driving circuit comprises N groups of touch selection outputting units corresponding to the N groups of shift registers, the number of the stages of touch selection outputting units in each of the N groups of touch selection outputting units is less than the number of the stages of shift registers in each of the N groups of shift registers, wherein the each stage of touch selection outputting units comprises a strobe signal input terminal, and the strobe signal input terminal of each stage of touch selection outputting units in each group of touch selection outputting units are electrically connected with secondary trigger signal outputting terminals of different stages of shift registers in corresponding one of the N groups of shift registers. The method comprising dividing a scan phase of each display frame into N time periods, and sequentially driving each group of shift registers at one side and causing each stage of shift register in each group of shift registers to output a display scan signal and a secondary trigger signal, outputting a touch driving signal according to the secondary trigger signal received by the strobe signal input terminal by each stage of touch selection output unit in each group of touch selection output units, and wherein the touch driving signal is not overlapped with the display scan signal in time domain.

According to the technical solution of the present disclosure, the shift registers disposed at at least one side of the peripheral region are divided into N groups of shift registers. The touch driving circuit comprises N groups of touch selection outputting units corresponding to the N groups of shift registers. The number of the stages of touch selection output units in each of the N groups of touch selection output units is less than the number of the stages of shift registers in each of the N groups of shift registers. Each stage of touch selection output unit includes a strobe signal input terminal, and the strobe signal input terminal of each stage of touch selection output units in each group of touch selection output units is electrically connected with secondary trigger signal output terminals of different stages of shift registers in corresponding one of the N groups of shift registers. When the touch display device is driven, a scan phase of each display frame is divided into N time periods, and sequentially driving each group of shift registers and causing each stage of shift register in each group of shift registers to output a display scan signal and a secondary trigger signal, outputting a touch driving signal according to the secondary trigger signal received by the strobe signal input terminal by each stage of touch selection output unit in each group of touch selection output units. The shift register in the gate electrode driving circuit provides a display scan signal for display and provides a touch driving signal for touch. As a result, as compared with the related art, it is not necessary to separately arrange a touch scan circuit, and hence the area occupied by the non-display region can be decreased, meeting the requirement for narrow-frame of the display panel by the user. In addition, N touch scans are performed in the scan phase of each display frame, so that it is realized that the touch scan effect of the N frequency doublings, thereby making the touch detecting more sensitive.

DETAILED DESCRIPTION OF THE PREFERRED EMBODIMENTS

The present disclosure will be described clearly and utterly in combination with the accompanying drawings and the embodiments in the present disclosure. It should be understood that the embodiments described herein are only part of embodiments. Based on the embodiments described in the present disclosure, other embodiments, obtained without any creative work, belong to the scope sought to be protected in the present disclosure.

Figure 1:
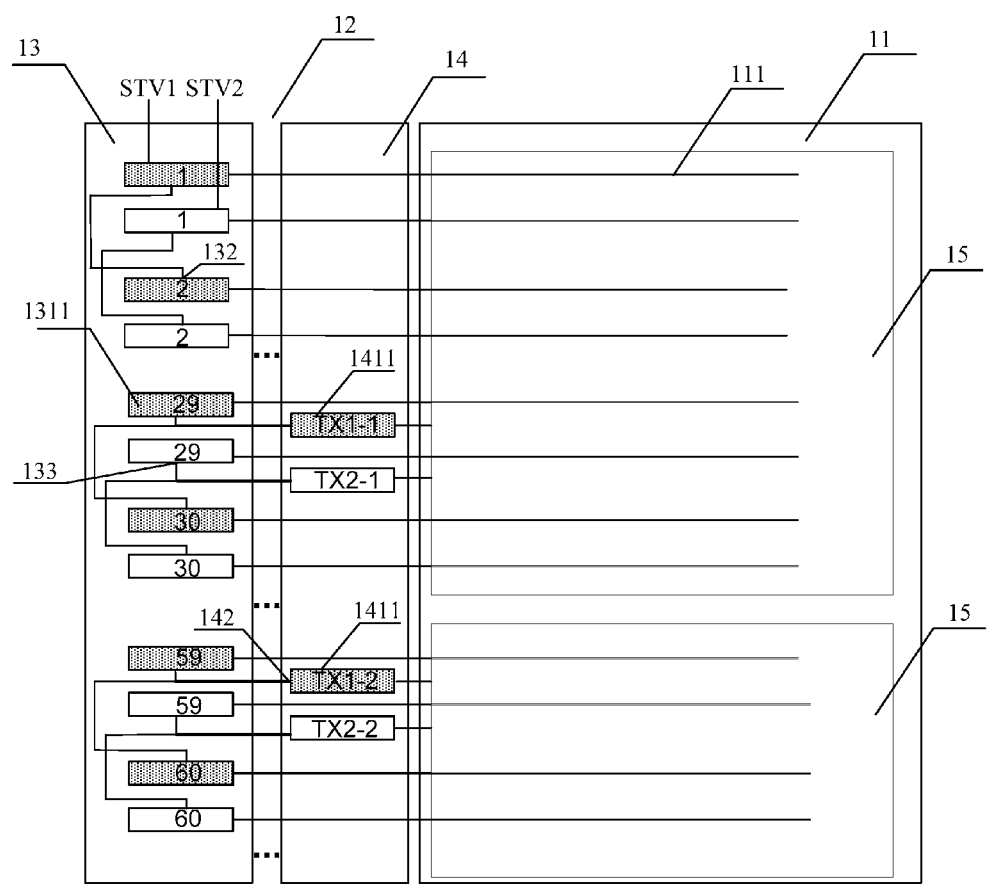
FIG. 1 is a schematic view showing the structure of an array substrate according to an embodiment of the present disclosure.

FIG. 1 is a schematic view showing the structure of an array substrate according to an embodiment of the present disclosure. As shown in FIG. 1, the array substrate includes a display region 11 and a peripheral region 12 around the display region 11. The display region 11 includes a plurality of scan lines 111 and the peripheral region 12 includes a gate electrode driving circuit 13 and a touch driving circuit 14. The gate electrode driving circuit 13 includes a plurality of stages of shift registers 131, each of the plurality of stages of shift registers 131 is arranged to correspond to and electrically connected to one of the plurality of scan lines 111, and the plurality of stages of shift registers 131 are disposed at one side or two sides of the peripheral region 12. The shift registers 131 disposed at at least one side of the peripheral region 12 are divided into N groups of shift registers, each stage of shift registers 131 in each of the N groups of shift registers are sequentially electrically connected with each other in series, and the stages of shift registers 131 from different groups of shift registers are arranged to be spaced apart from each other. Each stage of the shift register 131 includes a trigger signal input terminal 132 and a secondary trigger signal output terminal 133. For any two adjacent stages of shift registers 131 arranged to be electrically connected in series with each other in each group of shift registers, a trigger signal input terminal 132 of the succeeding stage of shift register 131 is electrically connected with a secondary trigger signal outputting terminal 133 of the preceding stage of shift register 131, where N is an integer larger than or equal to 2.

The touch driving circuit 14 includes N groups of touch selection output units corresponding to the N groups of shift registers, the number of each stage of touch selection output units 144 in each of the N groups of touch selection output units is less than the number of each stage of shift registers 131 in each of the N groups of shift registers, where each stage of touch selection outputting units 141 includes a strobe signal input terminal 142, and the strobe signal input terminal 142 of each stage of touch selection output units 141 in each group of touch selection output units is electrically connected with a secondary trigger signal output terminals 133 of different stages of shift registers 131 in one of the corresponding N groups of shift registers.

In the above illustrated embodiment, it is a case in which N groups of shift registers are provided in one side of the peripheral region of the array substrate and corresponds to N groups of touch selection output units. In this embodiment as shown in FIG. 1, N is equal to 2, i.e. including two group of shift registers and two groups of touch selection output units. Alternatively, N can be a positive integer larger than 2.

In addition, as for the two groups of shift registers as shown in FIG. 1, the group of first shift registers are mainly configured to provide a display scan signal to odd lines of scan lines, and the group of second shift registers are mainly configured to provide the display scan signal to even lines of scan lines.

Figure 2:
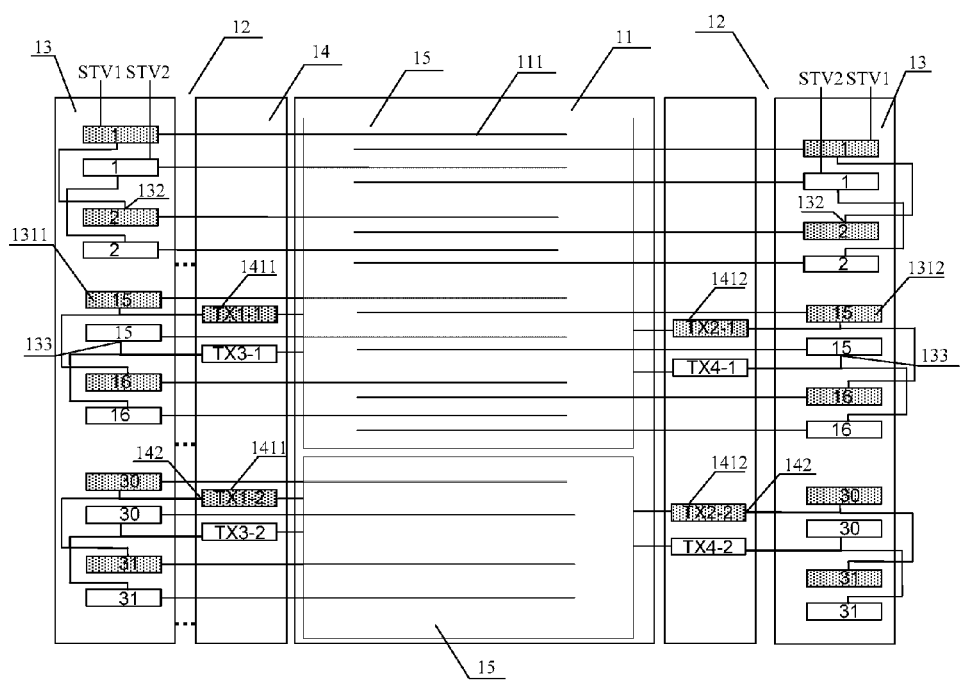
FIG. 2 is a schematic view showing the structure of an array substrate according to an embodiment of the present disclosure.

FIG. 2 is a schematic view showing the structure of an array substrate according to an embodiment of the present disclosure. As shown in FIG. 2, in the peripheral region 12 of the array substrate, the plurality of stages of shift registers include the plurality of stages of first shift registers 1311 disposed at a first side of the peripheral region 12 and are configured to provide a display scan signal for odd lines of scan lines 111, and the plurality of stages of second shift registers 1312 disposed at a second side of the peripheral region 12 and configured to provide the display scan signal for even lines of scan lines 111.

In addition, the plurality of stages of first shift registers 1311 located at the first side of the peripheral region 12 are divided into N groups of first shift registers, and the touch driving circuit 14 includes N groups of first touch selection output units disposed at the first side of the peripheral region and configured to correspond to the N groups of first shift registers. The plurality of stages of second shift registers 1312 disposed at a second side of the peripheral region are divided into N groups of second shift registers, and the touch driving circuit 14 includes N groups of second touch selection output units disposed at the second side of the peripheral region and configured to correspond to the N groups of second shift registers.

In some embodiments, as in this embodiment as shown in FIG. 2, the number of the groups of first shift registers disposed at the first side of the peripheral region 12 is equal to the number of the groups of second shift registers disposed at the second side of the peripheral region 12. Specifically, as shown in FIG. 2, the number of the groups of first shift registers and the groups of second shift registers is equal to 2.

In addition, the number of the first touch selection output units 1411 in each group of first touch selection output units disposed at the first side of the peripheral region 12 may be equal to the number of second touch selection output units 1412 in each group of second touch selection output units disposed at the second side of the peripheral region 12.

In this embodiment, in one group of touch selection output units, the same numbers of the stages of the shift registers are provided between any two adjacent stages of touch selection output units.

Specifically, referring to the embodiment as shown in FIG. 1, in a group of touch selection output units corresponding to the group of first shift registers. A first stage of touch selection output unit TX1-1 is electrically connected with a secondary trigger signal output terminal of the twentieth-nine stage of shift register. A second stage of touch selection output unit TX1-2 is electrically connected with a secondary trigger signal output terminal of the fiftieth-nine stage of shift register. Twenty-nine stages of shift registers are provided between two adjacent stages of touch selection output units, and the like. A third stage of touch selection output unit TX1-3 is electrically connected with a secondary trigger signal output terminal of the eightieth-nine stage of shift register and so on. In a group of touch selection output units corresponding to the group of second shift registers. A first stage of touch selection output unit TX2-1 is electrically connected with a secondary trigger signal output terminal of the twentieth-nine stage of shift register. A second stage of touch selection output unit TX2-2 is electrically connected with a secondary trigger signal output terminal of the fiftieth-nine stage of shift register. Twenty-nine stages of shift registers are provided between two adjacent stages of touch selection output units, and the like, a third stage of touch selection output unit TX2-3 is electrically connected with a secondary trigger signal output terminal of the eightieth-nine stage of shift register and so on.

Referring to an embodiment as shown in FIG. 2. In a group of touch selection output units corresponding to the group of first shift registers and located at a first side. A first stage of touch selection output unit TX1-1 is electrically connected with a secondary trigger signal output terminal of the fifteenth stage of shift register. A second stage of touch selection output unit TX1-2 is electrically connected with a secondary trigger signal output terminal of the thirtieth stage of shift register. Fourteen stages of shift registers are provided between two adjacent stages of touch selection output units, and the like. A third stage of touch selection output unit TX1-3 is electrically connected with a secondary trigger signal output terminal of the fortieth-five stage of shift register and so on. In a group of touch selection output units corresponding to the group of second shift registers and located at the first side. A first stage of touch selection output unit TX3-1 is electrically connected with a secondary trigger signal output terminal of the fifteenth stage of shift register. A second stage of touch selection output unit TX3-2 is electrically connected with a secondary trigger signal output terminal of the thirtieth stage of shift register. Fourteen stages of shift registers are provided between two adjacent stages of touch selection output units, and the like. A third stage of touch selection output unit TX3-3 is electrically connected with a secondary trigger signal output terminal of the fortieth-five stage of shift register and so on. In a group of touch selection output units corresponding to the group of first shift registers and located at a second side, a first stage of touch selection output unit TX2-1 is electrically connected with a secondary trigger signal output terminal of the fifteenth stage of shift register, a second stage of touch selection output unit TX2-2 is electrically connected with a secondary trigger signal output terminal of the thirtieth stage of shift register. Fourteen stages of shift registers are provided between two adjacent stages of touch selection output units, and the like. A third stage of touch selection output unit TX2-3 is electrically connected with a secondary trigger signal output terminal of the fortieth-five stage of shift register and so on. In a group of touch selection output units corresponding to the group of second shift registers and located at the second side. A first stage of touch selection output unit TX4-1 is electrically connected with a secondary trigger signal output terminal of the fifteenth stage of shift register. A second stage of touch selection output unit TX4-2 is electrically connected with a secondary trigger signal output terminal of the thirtieth stage of shift register. Fourteen stages of shift registers are provided between two adjacent stages of touch selection output units, and the like. A third stage of touch selection output unit TX4-3 is electrically connected with a secondary trigger signal output terminal of the fortieth-five stage of shift register and so on.

In this embodiment, in order for convenient description, the shift register located at the first side can be regarded as a first shift register. The group of shift registers located at the first side can be regarded as a first shift register group. The touch selection output unit located at the first side can be regarded as a first touch selection output unit. The group of touch selection output units located at the first side can be regarded as a first touch output unit group. The shift register located at the second side can be regarded as a second shift register. The group of shift registers located at the second side can be regarded as a second shift register group. The touch selection output unit located at the second side can be regarded as a second touch selection output unit. The group of touch selection output units located at the second side can be regarded as a second touch selection output unit group.

In the embodiments as shown in FIGS. 1 and 2, the display region 11 of the array substrate further are provided with a plurality of touch driving electrodes 15. The number of the touch driving electrodes 15 is equal to the maximal value between the numbers of the stages of touch selection output units in the groups of touch selection output units. In addition, the same stages of touch selection output units in each group of touch selection output units are electrically connected with the same one touch driving electrode 15.

The above plurality of touch driving electrodes are multiplexed as a common electrode. That is, the touch driving electrode and the common electrode can be realized by depositing an Indium tin oxide (ITO) layer on the array substrate. As compared with a case in which two ITO layers are arranged to realize the touch driving electrode and the common electrode, this design of the present disclosure can effectively decrease a thickness of the array substrate and also decrease the manufacturing process of the array substrate.

In the embodiments as shown in FIGS. 1 and 2, touch driving function and display function are integrated into one array substrate. A scan phase of each display frame can be divided into N time periods, and each group of shift registers are sequentially driven within the N time periods, so that each stage of shift register in each group of shift registers is to output a display scan signal and a secondary trigger signal, and each stage of touch selection output unit in each group of touch selection output units outputs a touch driving signal according to the second trigger signal received by the strobe signal input terminal, and the touch selection output unit outputs a touch driving signal during a time interval during which two adjacent stages of shift registers output the display scan signals. As a result, as compared with the related art, it is not necessary to separately arrange a touch scan circuit, and hence the area occupied by the non-display region can be decreased, thereby meeting the requirement for the narrow-frame of the display panel by the user. In addition, in the scan phase of each display frame, N touch scans are performed, so that the touch scan effect of the N frequency doublings can be achieved, thereby making the touch detecting more sensitive.

Figure 3:
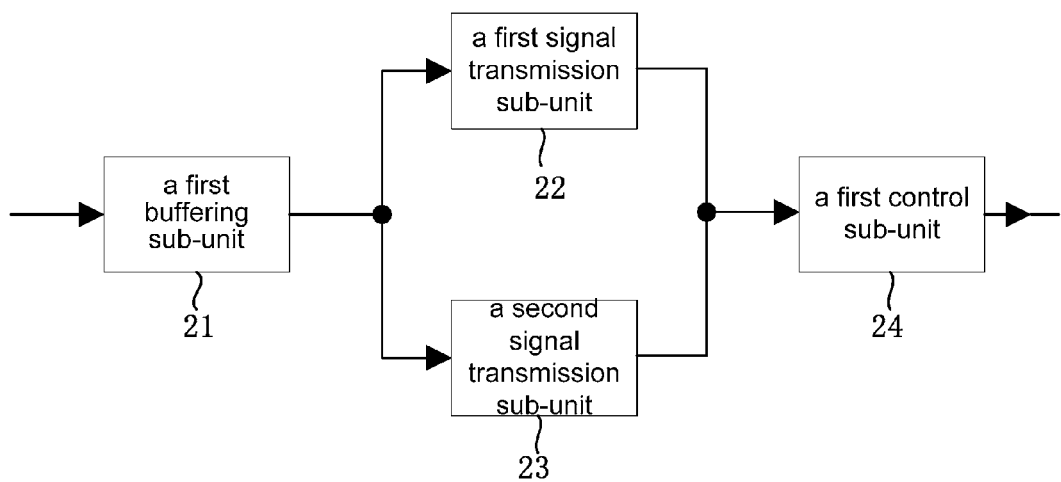
FIG. 3 is a schematic view showing the circuit structure of a touch selection output unit according to an embodiment of the present disclosure.

FIG. 3 is a schematic view showing the circuit structure of a touch selection output unit according to an embodiment of the present disclosure. As shown in FIG. 3, each stage of touch selection output unit further includes a first buffering sub-unit 21, a first signal transmission sub-unit 22, a second signal transmission sub-unit 23 and a first control sub-unit 24, where the first buffering sub-unit 21 is configured to buffer a first strobe signal received by the strobe signal input terminal.

The first signal transmission sub-unit 22 is configured to transmit a first signal according to a signal buffered by the first buffering sub-unit 21. The second signal transmission sub-unit 23 is configured to transmit a second signal according to the signal buffered by the first buffering sub-unit 21. The first control sub-unit 24 is configured to control if the first signal or the second signal is outputted from the first touch selection output unit.

Figure 4A:
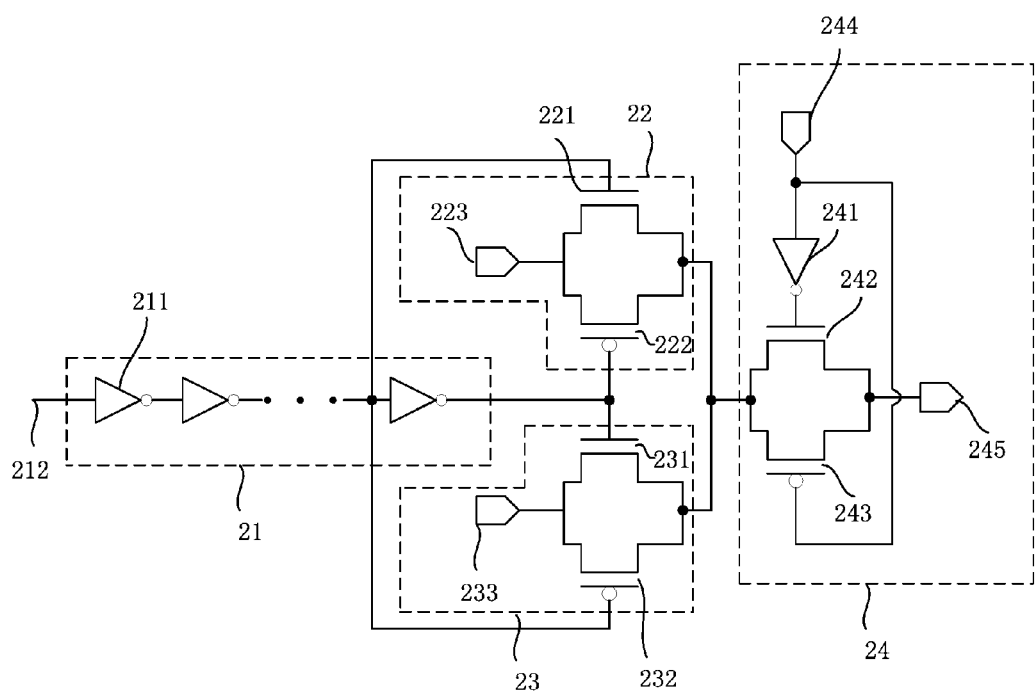
FIG. 4A is a schematic view showing the circuit structure of a touch selection output unit according to an embodiment of the present disclosure.
Figure 4B:
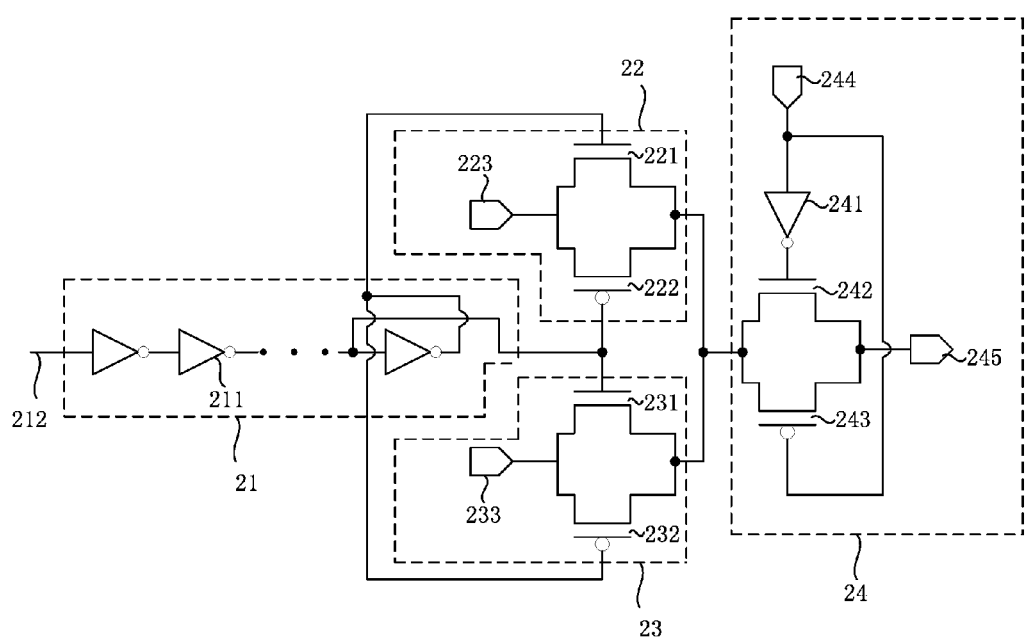
FIG. 4B is another schematic view showing the circuit structure of a touch selection output unit according to an embodiment of the present disclosure.

Specifically, FIG. 4A is a schematic view showing the circuit structure of a touch selection output unit according to an embodiment of the present disclosure. FIG. 4B is another schematic view showing the circuit structure of a touch selection output unit according to an embodiment of the present disclosure. Referring to FIGS. 4A and 4B, the first buffering sub-unit 21 includes L1 first inverters 211 electrically connected in series. An input terminal of the first first inverter 211 is electrically connected with a strobe signal input terminal 212. The L1th first inverter 211 is electrically with the first signal transmission sub-unit 22 and the second signal transmission sub-unit 23. L1 is an integer larger than 0.

The first signal transmission sub-unit 22 includes a first NMOS transistor 221, a first PMOS transistor 222 and a first signal input terminal 223. Referring to FIG. 4A, when L1 is an odd number, a gate electrode of the first NMOS transistor 221 is electrically connected with an input terminal of the L1th first inverter 211, a gate electrode of the first PMOS transistor 222 is electrically connected with an output terminal of the L1th first inverter 211. Referring to FIG. 4B, when L1 is an even number, the gate electrode of the first PMOS transistor 222 is electrically connected with the input terminal of the L1th first inverter 211, and the gate electrode of the first NMOS transistor 221 is electrically connected with the output terminal of the L1th first inverter 211. In addition, a source electrode of the first NMOS transistor 221 is electrically connected with a drain electrode of the first PMOS transistor 222 together and is electrically connected with the first signal input terminal 223, and a drain electrode of the first NMOS 221 is electrically connected with the source electrode of the first PMOS transistor 222 together and is electrically connected with the first control sub-unit 24.

The second signal transmission sub-unit 23 includes a second NMOS transistor 231, a second PMOS transistor 232 and a second signal input terminal 233. Referring to FIG. 4A, when L1 is an odd number, a gate electrode of the second PMOS transistor 232 is electrically connected with the input terminal of the L1th first inverter 211, a gate electrode of the second NMOS transistor 231 is electrically connected with the output terminal of the L1th first inverter 211; referring to FIG. 4B, when L1 is an even number, the gate electrode of the second NMOS transistor 231 is electrically connected with the input terminal of the L1h first inverter 211, and the gate electrode of the second PMOS transistor 232 is electrically connected with the output terminal of the L1th first inverter 211; a source electrode of the second NMOS transistor 231 is electrically connected with the drain electrode of the second PMOS transistor 232 together and is electrically connected with the second signal input terminal 233, and the drain electrode of the second NMOS 231 is electrically connected with the source electrode of the second PMOS transistor 232 together and is electrically connected with the first control sub-unit 24.

The first control sub-unit 24 includes a second inverter 241. A third NMOS transistor 242, a third PMOS transistor 243, a first control signal input terminal 244 and a first touch driving signal output terminal 245. An input terminal of the second inverter 241 is electrically connected with the first control signal input terminal 244 and a gate electrode of the third PMOS transistor 243, an output terminal of the second inverter 241 is electrically connected with a gate electrode of the third NMOS transistor 242; a source electrode of the third NMOS transistor 242 and a drain electrode of the third PMOS transistor 243 are electrically connected together and are electrically connected with the drain electrode of the first NMOS transistor 221 and the drain electrode of the second NMOS transistor 231, and a drain electrode of the third NMOS transistor 242 and a source electrode of the third PMOS transistor 243 are electrically connected together and are electrically connected with the first touch driving signal output terminal 245.

Figure 4C:
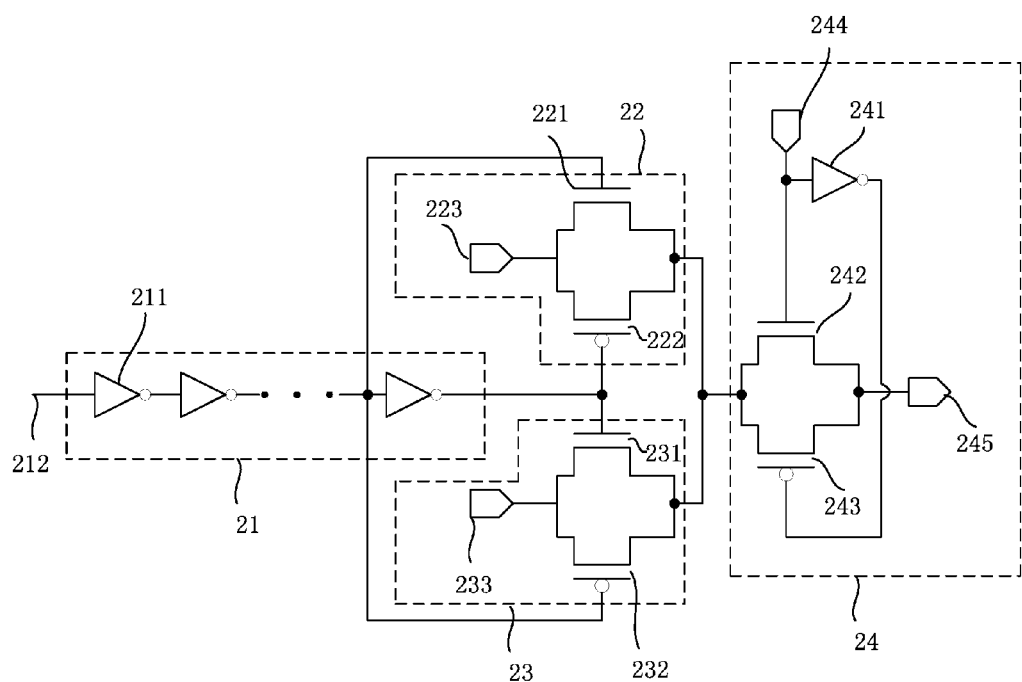
FIG. 4C is still another schematic view showing the circuit structure of a touch selection output unit according to an embodiment of the present disclosure.
Figure 4D:
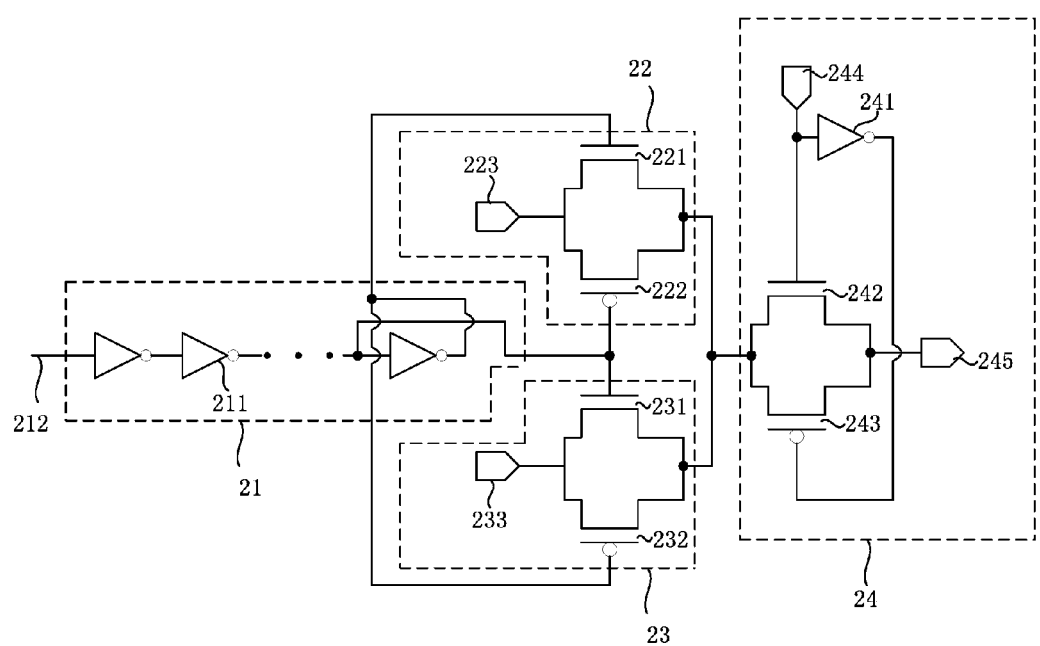
FIG. 4D is still another schematic view showing the circuit structure of a touch selection output unit according to an embodiment of the present disclosure.

In addition, as compared with FIGS. 4A and 4B, in FIGS. 4C and 4D, it is possible that an input terminal of the second inverter 241 is electrically connected with the first control signal input terminal 244 and a gate electrode of the third NMOS transistor 242, and an output terminal of the second inverter 241 is electrically connected with a gate electrode of the third PMOS transistor 242.

With respect to the touch selection output units illustrated in above FIGS. 4A and 4B, the first control signal input terminal 244 inputs a first control signal SW, the first strobe signal input terminal 212 inputs a first strobe signal C, the first signal input terminal 223 inputs a first signal TXH, the second signal input terminal 233 inputs a second signal TXL, and the first touch driving signal output terminal 245 outputs a touch driving signal OUT, the principle thereof is shown in Table 1 as follows:

TABLE 1

| SW | C | OUT |
|----|---|-----|
| H  | H | Hi-Z |
| H  | L | Hi-Z |
| L  | H | TXH |
| L  | L | TXL |

That is, when the first control signal SW inputted to the first control signal input terminal is a high level signal H, no matter the first strobe signal inputted to the first strobe signal input terminal 212 is a high level signal H or a low level signal L, the third NMOS transistor 242 and the third PMOS transistor 243 are both maintained at a turn-off state, and the first touch driving signal output terminal 245 is maintained at a high-resistance state Hi-Z (i.e. a flight state).

When the first control signal SW inputting to the first control signal input terminal 244 is a low level signal L, the third NMOS transistor 242 and the third PMOS transistor 243 are turned on. At that time, if the first strobe signal inputted to the first strobe signal input terminal 212 is a high level signal H, the first NMOS transistor 221 and the first PMOS transistor 222 of the second signal transmission sub-unit 22 are turned on. The first signal TXH inputted to the first signal input terminal 223 is transmitted to the first touch driving signal output terminal 245 and is used as a touch driving signal OUT. At this time, if the first strobe signal inputted to the second strobe signal input terminal 212 is a low level signal L. The second NMOS transistor 231 and the second PMOS transistor 232 of the second signal transmission sub-unit 23 are turned on, and the first signal TXL inputted to the second signal input terminal 223 is transmitted to the first touch driving signal output terminal 245, and is used as a touch driving signal OUT.

With respect to the touch selection output unit as shown in FIGS. 4C and 4D, the principle thereof is as follows:

TABLE 2

| SW | C | OUT |
|----|---|-----|
| H  | H | TXH |
| H  | L | TXL |
| L  | H | Hi-Z |
| L  | L | Hi-Z |

That is, when the first control signal SW inputted to the first control signal input terminal 244 is a low level signal L, no matter the first strobe signal C inputted to the first strobe signal input terminal 212 is a high level signal H or a low level signal L. The third NMOS transistor 242 and the third PMOS transistor 243 are both maintained at a turn-off state, and the first touch driving signal output terminal 245 is maintained at a high-resistance state Hi-Z (i.e. a flight state).

When the first control signal SW inputted to the first control signal input terminal 244 is a high level signal H. The third NMOS transistor 242 and the third PMOS transistor 243 are turned on. At this time, if the first strobe signal inputted to the first strobe signal input terminal 212 is a high level signal H. The first NMOS transistor 221 and the first PMOS transistor 222 of the first signal transmission sub-unit 22 are turned on. The first signal TXH inputted to the first signal input terminal 223 is transmitted to the first touch driving signal output terminal 245 and is used as a touch driving signal OUT; at this time. if the first strobe signal inputted to the second strobe signal input terminal 212 is a low level signal L. The second NMOS transistor 231 and the second PMOS transistor 232 of the second signal transmission sub-unit 23 are turned on. and the first signal TXL inputted to the second signal input terminal 223 is transmitted to the first touch driving signal output terminal 245, and is used as a touch driving signal OUT.

It can be known from the above tables 1 and 2, in the embodiments as shown in FIGS. 4A and 4B, where when the first control signal SW is a low level signal L, the touch selection output unit can perform an effective output. However, in the embodiments as shown in FIGS. 4C and 4D, when the first control signal SW is a high level signal H, the touch selection output unit can perform an effective output. As a result, with respect to the embodiments as shown in FIGS. 1 and 2, as for a case in which two groups of shift registers and two groups of touch selection output units are provided at a side of the peripheral region 12, it is possible that the group of first touch selection output units select the touch selection output units as shown in FIG. 4A or 4B, and the group of second touch selection output units select the touch selection output units as shown in FIG. 4C or 4D. Also, the above two groups of touch selection output units can be controlled by the same one first control signal SW, at the same time period, only one touch selection output unit can perform an effective output.

In various embodiments, the touch signal circuit further includes a first signal line 31, a second signal line 32 and a first control signal line 33. The first signal input terminal 223 of each stage of touch selection output unit is electrically connected with first signal line 31. The second signal input terminal 233 of each stage of touch selection output unit is electrically connected with the second signal line 32, and the first control signal input terminal of each stage of touch selection output unit is electrically connected with the first control signal line 22.

Specifically, with respect to the technical solution of the above embodiment in which the touch driving electrode is multiplexed as a common electrode. In this embodiment, the first signal line 31 can be used as an input line of a touch driving signal and the second signal line 32 can be an input line of a common voltage signal. Specifically, it can be known from the above tables 1 and 2, through the first control signal SW outputted by the first control signal line 33 and the first strobe signal C inputting to the first strobe signal input terminal 212, the touch driving signal is selectively outputted to the touch driving electrode; or the common voltage signal is outputted to the touch driving electrode to be used as a common electrode.

Figure 5:
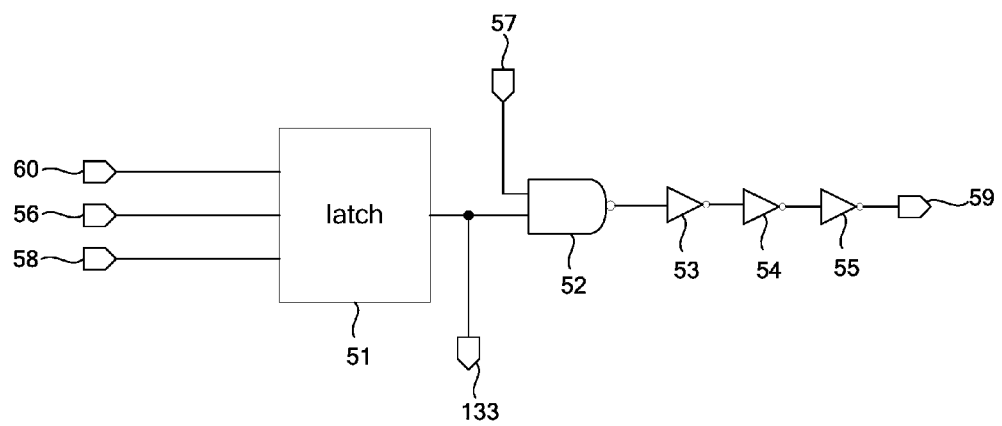
FIG. 5 is a schematic view showing the circuit structure of a shift register according to an embodiment of the present disclosure.

FIG. 5 is a schematic view showing the circuit structure of a shift register according to an embodiment of the present disclosure. As shown in FIG. 5, each shift register further includes a latch 51, an NAND gate 52, a fourth inverter 53, a fifth inverter 54, a sixth inverter 55, a first clock signal input terminal 56, a second clock signal input terminal 57, a reset signal input terminal 58, a scan signal output terminal 59 and a trigger signal output terminal 60.

In addition, a first input terminal of the latch 51 is electrically connected with the first clock signal input terminal 56 of the shift register, a second input terminal of the latch 51 is electrically connected with the trigger signal input terminal 60 of the shift register, a third input terminal of the latch 51 is electrically connected with the reset signal input terminal 58 of the shift register, and an output terminal of the latch 51 is electrically connected with the secondary trigger signal output terminal 133;

A first input terminal of the NAND gate 52 is electrically connected with the output terminal of the latch 51, a second input terminal of the NAND gate 52 is electrically connected with the second clock signal input terminal 57, an output terminal of the NAND gate 52 is electrically connected with an input terminal of the fourth inverter 53, and the fourth inverter 53, the fifth inverter 54 and the sixth inverter 55 are sequentially electrically in series with each other, and an output terminal of the sixth inverter 55 is electrically with the scan signal output terminal 59.

Figure 6:
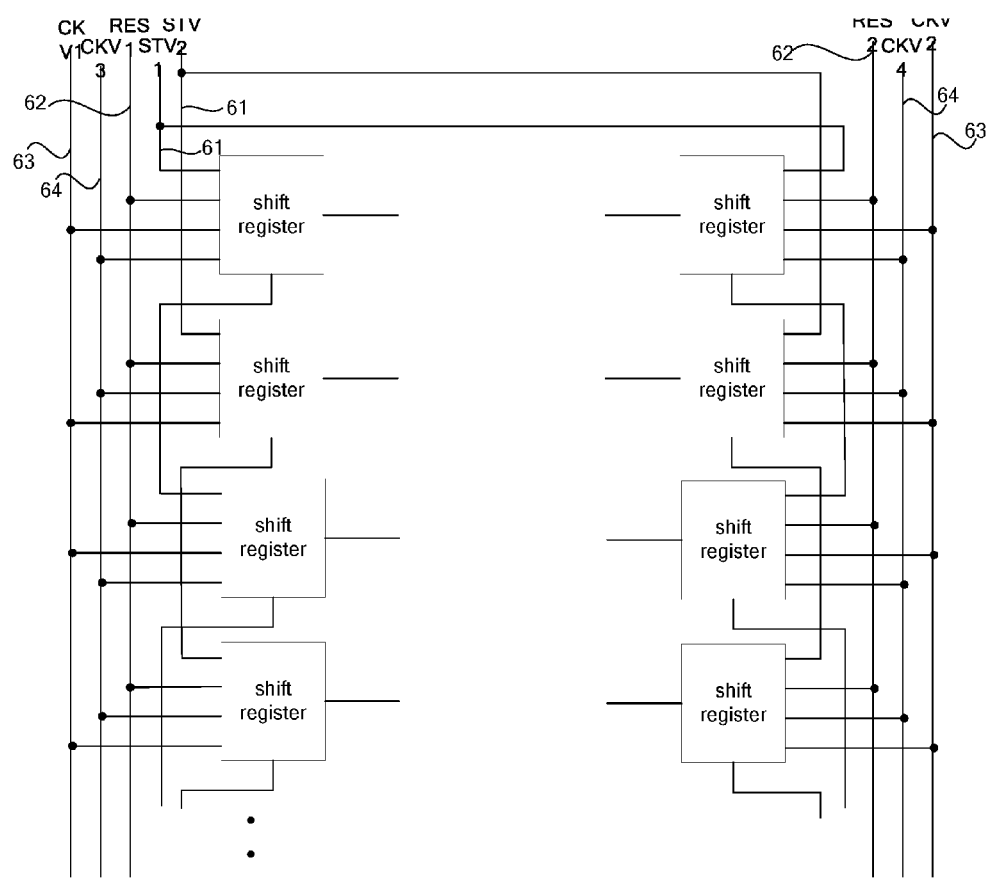
FIG. 6 is a schematic view showing the circuit structure of a gate driving circuit according to an embodiment of the present disclosure.

FIG. 6 is a schematic view showing the circuit structure of a gate driving circuit according to an embodiment of the present disclosure. As shown in FIG. 6, referring to FIG. 6, the gate driving circuit further includes a plurality of trigger signal lines 61 and a plurality reset signal lines 62. The reset signal lines can be represented by RES1 and RES2. and the RES1 and RES2 can be reset by the same reset signal; where a trigger signal input terminal 60 of a first stage of shift register in each group of shift registers is electrically connected with one of the trigger signal lines 61. A trigger signal input terminal of the other stage of shift register is electrically connected with a secondary trigger signal output terminal of the preceding stage of shift register. The rest signal input terminal of each stage of shift register in each group of shift registers is electrically connected with one of the reset signal lines 62. In addition, for different groups of shift registers located at the same side. Since it is necessary that the shift registers are started and output the secondary trigger signal in a different time period of the scan phase of the display frame. The first shift registers in different groups of shift registers located at the same one side are electrically connected with different touch signal lines. In the embodiment as shown in FIG. 6. Each side of the peripheral region is provided with two groups of shift registers. so that it is provide with a trigger signal line 61 in order to output trigger signals STV1 and STV2.

In addition, for the first stage of shift registers of the group of shift registers located at different sides. For example, the first stage of shift register of the first group of shift registers located at the first side, and the first stage of shift register of the first group of shift registers locate at the second side. Both of them can be electrically connected with the same trigger signal line (receiving STV1). Similarly, for example, the first stage of shift register of the second group of shift registers located at the first side. The first stage of shift register of the second group of shift registers locate at the second side. Both of them can be electrically connected with the same trigger signal line (receiving STV2).

Further, as shown in FIG. 6, the gate driving circuit further includes a plurality of first clock signal lines 63 and a plurality of second clock signal lines 64 disposed at one side or two sides of the peripheral region. First clock signal input terminals 56 of each stage of shift registers in each group of shift registers are alternately electrically with the first clock signal line 63 and the second clock signal line 64. Second clock signal terminals of each stage of shift registers in each group of shift registers are alternately electrically with the first clock signal line 63 and the second clock signal line 64. The first clock signal terminal and the second clock signal terminal of each stage of shift register are electrically with different clock signal lines. Specifically, for a case in which the first side and the second side of the peripheral region are provided with the shift registers. It is necessary that the first side and the second side of the peripheral region are also provided with the first clock signal line and the second clock signal line. As shown in FIG. 6, the first side of the peripheral region is provided with the first clock signal line 63 and the second clock signal line 64, which output clock signals CKV1 and CKV3 respectively. In addition. The second side of the peripheral region is also provided with the first clock signal line 63 and the second clock signal line 64, which output clock signals CKV2 and CKV4 respectively.

With respect to the operation principles of the shift register as shown in FIG. 5 and the gate driving circuit as shown in FIG. 6, both of them are known by those skilled in the art and are not described in detail herein.

Figure 7:
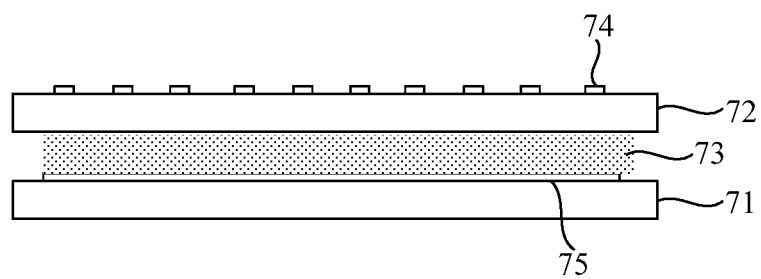
FIG. 7 is a schematic view showing the structure of a touch display panel according to an embodiment of the present disclosure.

FIG. 7 is a schematic view showing the structure of a touch display panel according to an embodiment of the present disclosure. As shown in FIG. 7, the touch display device in the present disclosure includes an array substrate 71, a color filter substrate 72 opposite to the array substrate 71 and a liquid crystal layer 73 disposed between the array substrate 71 and the color filter substrate 72, where the array substrate is the one according to any one of the above embodiments as shown in FIGS. 1-6.

The touch display device further includes a plurality of touch sensing electrodes 74 disposed at a side of the color filter substrate 72 that is away from the liquid crystal layer 73, where the touch sensing electrodes 74 are intersected with the touch driving electrodes 75 disposed on the array substrate 71.

In the embodiment as shown in FIG. 7, touch driving function and display function are integrated into one array substrate. A scan phase of each display frame can be divided into N time periods, and each group of shift registers are sequentially driven within the N time periods, and hence each stage of shift register in each group of shift registers is caused to output a display scan signal and a secondary trigger signal. Each stage of touch selection output unit in each group of touch selection output units outputs a touch driving signal according to the second trigger signal received by the strobe signal input terminal. The touch selection output unit outputs a touch driving signal during a time interval during which two adjacent stages of shift registers output the display scan signals. As a result, as compared with the related art, it is not necessary to separately arrange a touch scan circuit, and hence the area occupied by the non-display region can be decreased, thereby meeting the requirement for narrow-frame of the display panel by the user. In addition, in the scan phase of each display frame, N times of touch scans are performed, thereby realizing that the touch scan effect of the N frequency doublings, thereby making the touch detecting more sensitive The present disclosure also provides a method for driving a touch display device, the touch display device is the one in the embodiment as shown in FIG. 7, where the array substrate of the touch display device can be referred to the embodiments as shown in FIGS. 1-6, and includes a display region 11 and a peripheral region 12 around the display region 11, the display region 11 includes a plurality of scan lines 111 and the peripheral region 12 includes a gate electrode driving circuit 13 and a touch driving circuit 14.

The gate electrode driving circuit 13 includes a plurality of stages of shift registers 131, each of the plurality of stages of shift registers 131 is arranged to correspond to and electrically connected to one of the plurality of scan lines 111, and the plurality of stages of shift registers 131 are disposed at one side or two sides of the peripheral region 12;

The shift registers 131 disposed at at least one side of the peripheral region 12 are divided into N groups of shift registers, each stage of shift registers 131 in each of the N groups of shift registers are sequentially electrically connected with each other in series, and the each stage of shift registers 131 in different groups of shift registers are arranged to be spaced apart from each other, where each stage of the shift register 131 includes a trigger signal input terminal 132 and a secondary trigger signal outputting terminal 133; as for any two adjacent stages of shift registers 131 arranged to be electrically connected in series with each other in each group of shift registers, a trigger signal input terminal 132 of the succeeding stage of shift register 131 is connected with a secondary rigger signal outputting terminal 133 of the preceding stage of shift register thereof, where N is an integer larger than or equal to 2;

The touch driving circuit 14 includes N groups of touch selection output units corresponding to the N groups of shift registers, the number of each stage of touch selection output units 141 in each of the N groups of touch selection output units is less than the number of the each stage of shift registers 131 in each of the N groups of shift registers, where each stage of touch selection output unit 141 includes a strobe signal input terminal 142, and the strobe signal input terminals 142 of each stage of touch selection output units 141 in each group of touch selection output units are electrically connected with the corresponding secondary trigger signal output terminals 133 of different stages of shift registers 131 in one of the N groups of shift registers.

The control method including dividing a scan phase of each display frame into N time periods, and sequentially driving each group of shift registers and causing each stage of shift register in each group of shift registers to output a display scan signal and a secondary trigger signal, outputting a touch driving signal according to the secondary trigger signal received by the strobe signal input terminal by each stage of touch selection output unit in each group of touch selection output units, and where the touch selection output unit outputs a touch driving signal during a time interval in which two adjacent stages of shift registers output the display scan signals.

In the above driving manner, N times of touch scans are performed in a scan phase of each display frame, so that it is realized that the touch scan effect of the N frequency doublings, thereby making the touch detecting more sensitive. Further, referring to the above embodiments of the array substrate, the plurality of stages of shift registers include a first shift register of the plurality of stages of shift registers disposed at a first side of the peripheral region and configured to provide display scan signals for odd lines of scan lines. A second shift register of the plurality of stages of shift registers disposed at a second side of the peripheral region and configured to provide the display scan signals for even lines of scan lines. The first shift register of the plurality of stages of shift registers is divided into N groups of first shift registers. The touch driving circuit includes N groups of first touch selection output units disposed at the first side of the peripheral region and configured to corresponding to the N groups of first shift registers. The second shift register of the plurality of stages of shift registers is divided into N groups of second shift registers. The touch driving circuit includes N groups of second touch selection output units disposed at the second side of the peripheral region and configured to corresponding to the N groups of second shift registers. The number of the groups of first shift registers disposed at the first side of the peripheral region is the same to the number of the groups of second shift registers disposed at the second side of the peripheral region. The same stage of touch selection output units in each group of touch selection output units are electrically connected with the same touch driving electrode. As shown in FIG. 2, the first side of the peripheral region is provided with two groups of first shift registers and corresponding two groups of first touch selection output units, and the second side of the peripheral is provided with two groups of second shift registers and corresponding two groups of second touch selection output units.

During a time period i, the i-th group of first touch selection output units located at a first side of the peripheral region and the j-th stage of first touch selection output unit electrically connected with the j-th touch driving electrode, and the i-th group of second touch selection output units located at a second side of the peripheral region and the j-th stage of second touch selection output unit electrically connected with the j-th touch driving electrode, during a time period in which receiving the secondary trigger signal at the same time, output a touch driving signal to the j-th touch driving electrode, where i is a positive integer larger than 0 and less than or equal to N, j is a positive integer.

Figure 8:
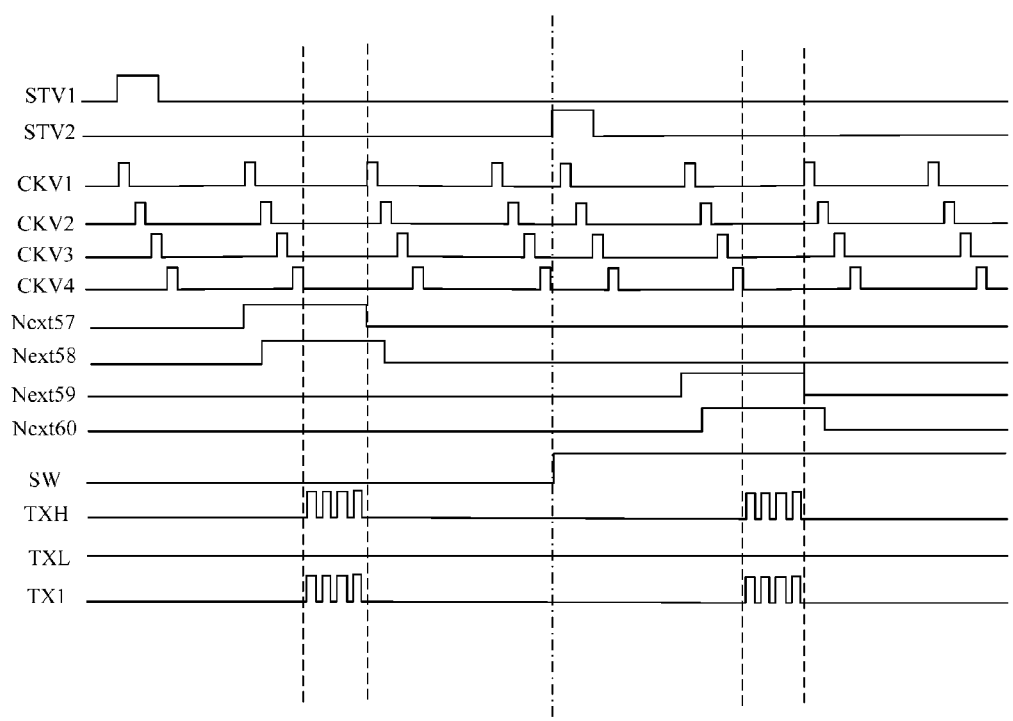
FIG. 8 is a time sequence diagram of a driving method for a touch display device according to the present disclosure.

FIG. 8 is a time sequence diagram of a driving method for a touch display device according to the present disclosure. Specifically, for the array substrate as shown in FIG. 2, the driving method thereof can be shown in FIG. 8. Referring to the above figures, the working process can be divided into two time periods. In a first time period, the first group of first shift registers and the first group of first touch selection output units located at the first side, and the first group of second shift registers and the first group of second touch selection output units located at the second side are operated. In second time period, the second group of first shift registers and the second group of first touch selection output units located at the first side, and the second group of second shift registers and the second group of second touch selection output units located at the second side are operated.

Specifically, it can be arranged that the first control signal SW is a low level signal in the first time period, and is a high level signal in the second time period.

Referring to FIG. 8, the first group of first shift registers located at the first side and the first group of second shift registers located at the second side can be triggered by a trigger signal STV1 within the beginning of the first time period, while the first group of first shift registers located at the first side and the first group of second shift registers located at the second side can be triggered by a trigger signal STV2 within the beginning of the second time period.

According to FIG. 8. in the group of first touch selection output units corresponding to the first group of first shift registers located at the first side. The first stage of first touch selection output unit is electrically connected with a secondary trigger signal output terminal of the fifteenth stage of first shift register. and the fifteenth stage of first shift register outputs a scan signal and a fifteenth stage of secondary trigger signal. Since the scan signal is transmitted to the fiftieth-seven scan line of the array substrate. the secondary trigger signal is presented as a NEXT57. The duration time of the secondary trigger signal NEXT57 is a time period from a rising edge of the current clock signal CKV1 to a rising edge of the next clock signal CKV1; in the group of first touch selection output signal corresponding to the second group of first shift registers located at first side. The first stage of first touch selection output unit is electrically connected with a secondary trigger signal output terminal of the fifteenth stage of first shift register. and the fiftieth-nine stage of first shift register outputs a scan signal and a fifteenth stage of secondary trigger signal according to the clock signals CKV1 and CKV3. Since the scan signal is transmitted to the fiftieth-nine scan line of the array substrate. The secondary trigger signal is presented as a NEXT59. The duration time of the secondary trigger signal NEXT59 is a time period from a rising edge of the current clock signal CKV1 to a rising edge of the next clock signal.

In addition. in the group of second touch selection output units corresponding to the first group of second shift registers located at the second side. The first stage of second touch selection output unit is electrically connected with a secondary trigger signal output terminal of the fiftieth-eight stage of second shift register. The fifteenth stage of second shift register outputs a scan signal and a fifteenth stage of secondary trigger signal according to the clock signals CKV2 and CKV4. Since the scan signal is transmitted to the fiftieth-eight scan line of the array substrate. the secondary trigger signal is presented as a NEXT58. The duration time of the secondary trigger signal NEXT58 is a time period from a rising edge of the current clock signal CKV2 to a rising edge of the next clock signal CKV2. In the group of second touch selection output signal corresponding to the second group of second shift registers located at second side. The first stage of second touch selection output unit is electrically connected with a secondary trigger signal output terminal of the fifteenth stage of second shift register. The fifteenth stage of second shift register outputs a scan signal and a fifteenth stage of secondary trigger signal according to the clock signals CKV2 and CKV4. Since the scan signal is transmitted to the sixtieth scan line of the array substrate. The secondary trigger signal is presented as a NEXT60. The duration time of the secondary trigger signal NEXT60 is a time period from a rising edge of the current clock signal CKV2 to a rising edge of the next clock signal CKV2.

Referring to FIG. 8, in a first time period. the first stage of first touch selection output unit in the first group of first touch selection output units located at the first side. The first stage of second touch selection output unit in the first group of second touch selection output units located at the second side. Both output a touch driving signal to the first touch driving electrode in a time period of simultaneously receiving the secondary trigger signals NEXT57 and NEXT58. In addition. The display scan signals of the shift registers generally are overlapped with a pulse time of the clock signals (CKV1. CKV2. CKV3 and CKV4). As a result, in order to separate the touch time and display time. That is, in order to ensure that the above touch driving signal is not overlapped with the display scan signal over the time. In the embodiment as shown in FIG. 8. the touch driving signal is initially outputted at a falling edge of the clock signal CKV4. Since the touch driving signal is transmitted to the first touch driving electrode, the touch driving signal can be represented as TX1. At the same time. as for the above first touch selection output unit and the second touch selection output unit, the signal input terminals thereof receive two signals. That is, a first signal TXH and a second signal TXL. If the above touch driving electrode can be multiplexed as a common electrode simultaneously, the first signal TXL can be regarded as a common voltage signal applied to the common electrode. and the TXH can be regarded as a touch driving signal.

In a second time period. the first stage of first touch selection output unit in the second group of first touch selection output units located at the first side. The first stage of second touch selection output unit in the second group of second touch selection output units located at the second side. Both output a touch driving signal to the first touch driving electrode in a time period of simultaneously receiving the secondary trigger signals NEXT59 and NEXT60. In addition, the display scan signals of the shift registers generally are overlapped with a pulse time of the clock signals (CKV1. CKV2.CKV3 and CKV4). As a result, in order to separate the touch time and display time. That is, in order to ensure that the above touch driving signal is not overlapped with the display scan signal over the time. in the embodiment as shown in FIG. 8. The touch driving signal is initially outputted at a falling edge of the clock signal CKV4. Since the touch driving signal is transmitted to the first touch driving electrode, the touch driving signal can be represented as TX1. Based on the same reason, as for the above the first touch selection output unit and the second touch selection output unit. the signal input terminals thereof receive two signals. that is. the first signal TXH and the second signal TXL. If the above touch driving electrode can be multiplexed as a common electrode simultaneously. the first signal TXL can be regarded as a common voltage signal applied to the common electrode. and the TXH can be regarded as a touch driving signal.

Although some embodiments and the applied technology principles of the present disclosure have been described as above, it should be understood by those skilled in the art that the present disclosure is not limited to particular embodiments described herein. Various modifications, readjustment and alternations can be made by those skilled in the art without departing the scope of protection of the present disclosure, and these modifications, readjustment and alternations fall within the scope of the present disclosure which is subject to the appended claims.

The invention claimed is:
1. An array substrate, comprising:
 a display region and a peripheral region around the display region, the display region comprises a plurality of scan lines and the peripheral region comprises a gate electrode driving circuit and a touch driving circuit, wherein, the gate electrode driving circuit comprises a plurality of stages of shift registers, wherein
- each of the plurality of stages of shift registers corresponds to and is electrically connected to one of the plurality of scan lines;
- the plurality of stages of shift registers being disposed at one side or two sides of the peripheral region;
- the shift registers disposed at at least one side of the peripheral region are divided into N groups of shift registers, wherein N is an integer larger than or equal to 2;
- the stages of shift registers in each of the N groups of shift registers are sequentially electrically connected with each other in series;
- the stages of shift registers from different groups of shift registers are arranged to be spaced apart from each other;
- each stage of the shift register comprises a trigger signal input terminal and a secondary trigger signal output terminal; and
- for any two adjacent stages of shift registers arranged to be electrically connected in series with each other in each group of shift registers, a trigger signal input terminal of the succeeding stage of shift register is electrically connected with a secondary trigger signal output terminal of the preceding stage of shift register; and the touch driving circuit comprises N groups of touch selection output units corresponding to the N groups of shift registers, wherein
- the number of the stages of touch selection output units in each of the N groups of touch selection output units is less than the number of the stages of shift registers in each of the N groups of shift registers;
- the each stage of touch selection output units comprises a strobe signal input terminal; and
- the strobe signal input terminal of each stage of touch selection output units in each group of touch selection output units is electrically connected with the secondary trigger signal output terminals of different stages of shift registers in corresponding one of the N groups of shift registers.

2. The array substrate of claim 1, wherein the plurality of stages of shift registers comprise a plurality of stages of first shift registers disposed at a first side of the peripheral region and are configured to provide a display scan signal for odd lines of scan lines, and a plurality of stages of second shift registers disposed at a second side of the peripheral region and are configured to provide the display scan signal for even lines of scan lines;
- the plurality of stages of the first shift registers are divided into N groups of first shift registers;
- the touch driving circuit comprises N groups of first touch selection output units disposed at the first side of the peripheral region and is configured to correspond to the N groups of first shift registers;
- the plurality of stages of the second shift registers are divided into N groups of second shift registers; and
- the touch driving circuit comprises N groups of second touch selection output units disposed at the second side of the peripheral region and configured to correspond to the N groups of second shift registers.

3. The array substrate of claim 2, wherein the number of the groups of first shift registers disposed at the first side of the peripheral region is equal to the number of the groups of second shift registers disposed at the second side of the peripheral region.

4. The array substrate of claim 3, wherein the number of the first touch selection output units in each group of first touch selection output units disposed at the first side of the peripheral region is equal to the number of second touch selection outputting units in each group of second touch selection output units disposed at the second side of the peripheral region.

5. The array substrate of claim 3, wherein the number of the groups of first shift registers and the number of the groups of second shift registers are equal to 2.

6. The array substrate of claim 1, each stage of touch selection output unit further comprises a first buffering sub-unit, a first signal transmission sub-unit, a second signal transmission sub-unit and a first control sub-unit, wherein the first buffering sub-unit is configured to buffer a first strobe signal received by the strobe signal input terminal;
- the first signal transmission sub-unit is configured to transmit a first signal according to the signal buffered by the first buffering sub-unit;
- the second signal transmission sub-unit is configured to transmit a second signal according to the signal buffered by the first buffering sub-unit; and
- the first control sub-unit is configured to control whether the first signal or the second signal is outputted from the first touch selection output unit.

7. The array substrate of claim 6, wherein
the first buffering sub-unit comprises L1 number of first-inverters electrically connected in series, an input terminal of the first inverter is electrically connected with the strobe signal input terminal, the L1-th first-inverter is electrically connected with the first signal transmission sub-unit and the second signal transmission sub-unit, wherein L1 is an integer larger than 0;

the first signal transmission sub-unit comprises a first NMOS transistor, a first PMOS transistor and a first signal input terminal, wherein
- when L1 is an odd number, a gate electrode of the first NMOS transistor is electrically connected with an input terminal of the L1-th first-inverter, and a gate electrode of the first PMOS transistor is electrically connected with an output terminal of the L1-th first-inverter;
- when L1 is an even number, the gate electrode of the first PMOS transistor is electrically connected with the input terminal of the L1-th first-inverter, and the gate electrode of the first NMOS transistor is electrically connected with the output terminal of the L1-th first-inverter;
- a source electrode of the first NMOS transistor is electrically connected with a drain electrode of the first PMOS transistor together and is electrically connected with the first signal input terminal; and
- a drain electrode of the first NMOS is electrically connected with the source electrode of the first PMOS transistor together and is electrically connected with the first control sub-unit;

the second signal transmission sub-unit comprises a second NMOS transistor, a second PMOS transistor and a second signal input terminal, wherein
- when L1 is an odd number, a gate electrode of the second PMOS transistor is electrically connected with the input terminal of the L1-th first-inverter, a gate electrode of the second NMOS transistor is electrically connected with the output terminal of the L1-th first-inverter;

when L1 is an even number, the gate electrode of the second NMOS transistor is electrically connected with the input terminal of the L1-th first-inverter, and the gate electrode of the second PMOS transistor is electrically connected with the output terminal of the L1-th first-inverter;

a source electrode of the second NMOS transistor is electrically connected with the drain electrode of the second PMOS transistor together and is electrically connected with the second signal input terminal; and the drain electrode of the second NMOS is electrically connected with the source electrode of the second PMOS transistor together and is electrically connected with the first control sub-unit;

the first control sub-unit comprises a second inverter, a third NMOS transistor, a third PMOS transistor, a first control signal input terminal and a first touch driving signal output terminal, wherein an input terminal of the second inverter is respectively electrically connected with the first control signal input terminal and a gate electrode of the third PMOS transistor, an output terminal of the second inverter is electrically connected with a gate electrode of the third NMOS transistor; or the input terminal of the second inverter is respectively electrically connected with the first control signal input terminal and the gate electrode of the third NMOS transistor; and the output terminal of the second inverter is electrically connected with the gate electrode of the third PMOS transistor, a source electrode of the third NMOS transistor and a drain electrode of the third PMOS transistor are electrically connected with each other together and are electrically connected with the drain electrode of the first NMOS transistor and the drain electrode of the second NMOS transistor, and a drain electrode of the third NMOS transistor and a source electrode of the third PMOS transistor are electrically connected with each other together and are electrically connected with the first touch driving signal output terminal.

8. The array substrate of claim 6, wherein the touch driving circuit further comprises a first signal line, a second signal line and a first control signal line, and wherein the first signal input terminal of each stage of touch selection output unit is electrically connected with the first signal line, the second signal input terminal of each stage of touch selection output unit is electrically connected with the second signal line, and the first control signal input terminal of each stage of touch selection output unit is electrically connected with the first control signal line.

9. The array substrate of claim 1, wherein in each of the groups of touch selection output unit, same number of the stages of shift registers are provided between any two adjacent stages of touch selection output units.

10. The array substrate of claim 1, wherein the display region of the array substrate further comprises a plurality of touch driving electrodes, and the number of the touch driving electrodes is equal to the maximal value between the numbers of the stages of touch selection output units in the groups of touch selection output units; touch selection output units of the same stage in each group of touch selection output units are electrically connected with the same touch driving electrode.

11. The array substrate of claim 10, wherein the plurality of touch driving electrodes are multiplexed as a common electrode.

12. The array substrate of claim 1, wherein each shift register further comprises a latch, an NAND gate, a fourth inverter, a fifth inverter, a sixth inverter, a first clock signal input terminal, a second clock signal input terminal, a reset signal input terminal and a scan signal output terminal;

a first input terminal of the latch is electrically connected with the first clock signal input terminal of the shift register, a second input terminal of the latch is electrically connected with a trigger signal input terminal of the shift register, a third input terminal of the latch is electrically connected with the reset signal input terminal of the shift register, and an output terminal of the latch is electrically connected with the secondary trigger signal output terminal;

a first input terminal of the NAND gate is electrically connected with the output terminal of the latch, a second input terminal of the NAND gate is electrically connected with the second clock signal input terminal, an output terminal of the NAND gate is electrically connected with an input terminal of the fourth inverter, the fourth inverter, the fifth inverter and the sixth inverter are sequentially electrically in series with each other, and an output terminal of the sixth inverter is electrically with the scan signal output terminal.

13. The array substrate of claim 12, wherein the gate driving circuit further comprises a plurality of trigger signal lines and a plurality of reset signal lines;

a trigger signal input terminal of the first stage of shift register in each group of shift registers is electrically with one of the plurality of trigger signal lines, a rest signal terminal of each stage of shift registers in each group of shift registers is electrically connected with one of the plurality reset signal lines, and the first shift registers from different groups of shift registers located at the same side are electrically with different trigger signal lines.

14. The array substrate of claim 13, wherein the gate driving circuit further comprises a plurality of first clock signal lines and a plurality of second clock signal lines disposed at one side or two sides of the peripheral region, wherein first clock signal input terminals of the stages of shift registers in each group of shift registers are alternately electrically with the first clock signal line and the second clock signal line, second clock signal terminals of the stages of shift registers in each group of shift registers are alternately electrically with the first clock signal line and the second clock signal line, and the first clock signal terminal and the second clock signal terminal of each stage of shift register are electrically with different clock signal lines.

15. A touch display device, comprising an array substrate, a color filter substrate opposite to the array substrate and a liquid crystal layer disposed between the array substrate and the color filter substrate, wherein the array substrate comprises a display region and a peripheral region around the display region, the display region comprising a plurality of scan lines and the peripheral region comprising a gate electrode driving circuit and a touch driving circuit, wherein, the gate electrode driving circuit comprises a plurality of stages of shift registers, wherein each of the plurality of stages of shift registers corresponds to and is electrically connected to one of the plurality of scan lines;

the plurality of stages of shift registers being disposed at one side or two sides of the peripheral region;

the shift registers disposed at at least one side of the peripheral region are divided into N groups of shift registers, wherein N is an integer larger than or equal to 2;

the stages of shift registers in each of the N groups of shift registers are sequentially electrically connected with each other in series;

the stages of shift registers from different groups of shift registers are arranged to be spaced apart from each other;

each stage of the shift register comprises a trigger signal input terminal and a secondary trigger signal output terminal; and for any two adjacent stages of shift registers arranged to be electrically connected in series with each other in each group of shift registers, a trigger signal input terminal of the succeeding stage of shift register is electrically connected with a secondary trigger signal output terminal of the preceding stage of shift register; and the touch driving circuit comprises N groups of touch selection output units corresponding to the N groups of shift registers, wherein the number of the stages of touch selection output units in each of the N groups of touch selection output units is less than the number of the stages of shift registers in each of the N groups of shift registers;

the each stage of touch selection output units comprises a strobe signal input terminal; and the strobe signal input terminal of each stage of touch selection output units in each group of touch selection output units is electrically connected with the secondary trigger signal output terminals of different stages of shift registers in corresponding one of the N groups of shift registers.

16. The touch display device of claim 15, wherein the touch display device further comprises a plurality of touch sensing electrodes disposed at a side of the color filter substrate that is away from the liquid crystal layer, wherein the touch sensing electrodes are intersected with the touch driving electrodes disposed on the array substrate.

17. A method for driving a touch display device, wherein array substrate of the touch display device comprises a display region and a peripheral region around the display region, the display region comprises a plurality of scan lines and the peripheral region comprises a gate electrode driving circuit and a touch driving circuit, wherein, the gate electrode driving circuit comprises a plurality of stages of shift registers, each of the plurality of stages of shift registers is arranged to correspond to and electrically connected to one of the plurality of scan lines, and the plurality of stages of shift registers are disposed at one side or two sides of the peripheral region;

the shift registers disposed at at least one side of the peripheral region are divided into N groups of shift registers, each stage of shift registers in each of the N groups of shift registers being sequentially electrically connected with each other in series, and the stages of shift registers from different groups of shift registers being arranged to be spaced apart from each other, wherein each stage of the shift register comprises a trigger signal input terminal and a secondary trigger signal outputting terminal; and for any two adjacent shift registers arranged to be electrically connected in series with each other in each group of shift registers, a trigger signal input terminal of the succeeding stage of shift register is connected with a secondary rigger signal outputting terminal of the preceding stage of shift register, wherein N is an integer larger than or equal to 2;

the touch driving circuit comprises N groups of touch selection output units corresponding to the N groups of shift registers, the number of the stages of touch selection outputting units in each of the N groups of touch selection output units being less than the number of the stages of shift registers in each of the N groups of shift registers, wherein each stage of touch selection output unit comprises a strobe signal input terminal, and the strobe signal input terminal of each stage of touch selection output units in each group of touch selection output units is electrically connected with the secondary trigger signal output terminals of different stages of shift registers in corresponding one of the N groups of shift registers; the method comprising:

dividing a scan phase of each display frame into N time periods, and sequentially driving each group of shift registers at each side and causing each stage of shift register in each group of shift registers to output a display scan signal and a secondary trigger signal, outputting, by each stage of touch selection output unit in each group of touch selection output units, a touch driving signal according to the secondary trigger signal received by the strobe signal input terminal, and wherein the touch driving signal is not overlapped with the display scan signal in time domain.

18. The method for driving the touch display device of claim 17, wherein the plurality of stages of shift registers comprise the plurality of stages of first shift registers disposed at a first side of the peripheral region and configured to provide display scan signals for odd lines of scan lines, and the plurality of stages of second shift registers disposed at a second side of the peripheral region and configured to provide the display scan signals for even lines of scan lines;

the plurality of stages of first shift registers are divided into N groups of first shift registers, and the touch driving circuit comprises N groups of first touch selection output units disposed at the first side of the peripheral region and configured to corresponding to the N groups of first shift registers; the plurality of stages of second shift registers is divided into N groups of second shift registers, and the touch driving circuit comprises N groups of second touch selection output units disposed at the second side of the peripheral region and configured to corresponding to the N groups of second shift registers; and the number of the group of first shift registers disposed at the first side of the peripheral region is the same to the number of the group of second shift registers disposed at the second side of the peripheral region, wherein when the same stage of touch selection output units in each group of touch selection output units are electrically connected with the same touch driving electrode, during a time period i, the i-th group of first touch selection output units located at a first side of the peripheral region and the j-th stage of first touch selection output unit electrically connected with the j-th touch driving electrode, and the i-th group of second touch selection output units located at a second side of the peripheral region and the j-th stage of second touch selection output unit electrically connected with the j-th touch driving electrode, during a time period in which receiving the secondary trigger signal at the same time, output a touch driving signal to the j-th touch driving electrode, wherein i is a positive integer larger than 0 and less than or equal to N, j is a positive integer.

* * * * *